United States Patent
Chang et al.

(10) Patent No.: US 8,409,694 B2
(45) Date of Patent: Apr. 2, 2013

(54) COATED GLASS AND METHOD FOR MAKING THE SAME

(75) Inventors: Hsin-Pei Chang, New Taipei (TW); Wen-Rong Chen, New Taipei (TW); Huann-Wu Chiang, New Taipei (TW); Cheng-Shi Chen, New Taipei (TW); Jia Huang, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 16 days.

(21) Appl. No.: 13/170,935

(22) Filed: Jun. 28, 2011

(65) Prior Publication Data
US 2012/0207988 A1 Aug. 16, 2012

(30) Foreign Application Priority Data
Feb. 15, 2011 (CN) .......................... 2011 1 0038498

(51) Int. Cl.
| | | |
|---|---|---|
| *B32B 7/00* | (2006.01) | |
| *B32B 7/02* | (2006.01) | |
| *B32B 15/00* | (2006.01) | |
| *H01L 21/316* | (2006.01) | |
| *C08K 3/18* | (2006.01) | |
| *C08K 3/08* | (2006.01) | |
| *C08K 3/40* | (2006.01) | |
| *C09K 19/00* | (2006.01) | |

(52) U.S. Cl. ...... 428/213; 428/433; 428/1.32; 428/1.62; 428/615; 106/287.18; 106/425; 106/455

(58) Field of Classification Search .................. None
See application file for complete search history.

(56) References Cited

U.S. PATENT DOCUMENTS

| | | | | |
|---|---|---|---|---|
| 4,337,990 A | * | 7/1982 | Fan et al. ....................... 359/360 |
| 4,556,277 A | * | 12/1985 | Fan et al. ....................... 359/360 |
| 4,721,349 A | * | 1/1988 | Fan et al. ....................... 359/360 |
| 4,822,120 A | * | 4/1989 | Fan et al. ....................... 359/360 |
| 5,216,542 A | * | 6/1993 | Szczyrbowski et al. ...... 359/588 |
| 5,308,706 A | * | 5/1994 | Kawaguchi et al. ........... 428/426 |
| 5,780,149 A | * | 7/1998 | McCurdy et al. ............. 428/336 |
| 2003/0198808 A1 | * | 10/2003 | Muromachi et al. .......... 428/359 |
| 2009/0130409 A1 | * | 5/2009 | Reutler et al. ................ 428/216 |

* cited by examiner

*Primary Examiner* — David Sample
*Assistant Examiner* — Nicole T Gugliotta
(74) *Attorney, Agent, or Firm* — Altis Law Group, Inc.

(57) ABSTRACT

A coated glass includes a substrate, a first conductive layer, a metallic layer and a second conductive layer. The first conductive layer is deposited on the substrate. The metallic layer is deposited on the first conductive layer. The second conductive layer is deposited on the metallic layer. The first conductive layer and the second conductive layer are consisted of tin oxide, antimony oxide and zinc oxide, zinc oxide has a mole percentage in a range from about 30% to about 50%, antimony oxide has a mole percentage in a range from about 1% to about 5%, and the remaining is tin oxide.

9 Claims, 2 Drawing Sheets

COATED GLASS AND METHOD FOR MAKING THE SAME

BACKGROUND

1. Technical Field

The present disclosure relates to coated glass, particularly to a coated glass having a high conductivity property and a method for making the coated glass.

2. Description of Related Art

A glass sheet with a transparent conductive film formed thereon is used widely as a transparent conductor for a photovoltaic device such as a solar cell or the like and an image display device such as a liquid crystal display, a plasma display panel, or the like. For a building window, the glass sheet with a transparent conductive film is used as low-emissivity glass (Low-E glass), or electromagnetic wave shielding glass. As the transparent conductive film, an indium tin oxide (ITO) film has been known. However, since indium metal in use easily diffuse in the ITO film to affect conduct property, this causes ITO film to have unstable characteristics.

Therefore, there is room for improvement within the art.

BRIEF DESCRIPTION OF THE FIGURE

Many aspects of the coated glass can be better understood with reference to the following figures. The components in the figures are not necessarily drawn to scale, the emphasis instead being placed upon clearly illustrating the principles of the coated glass.

DETAILED DESCRIPTION

Figure 1:
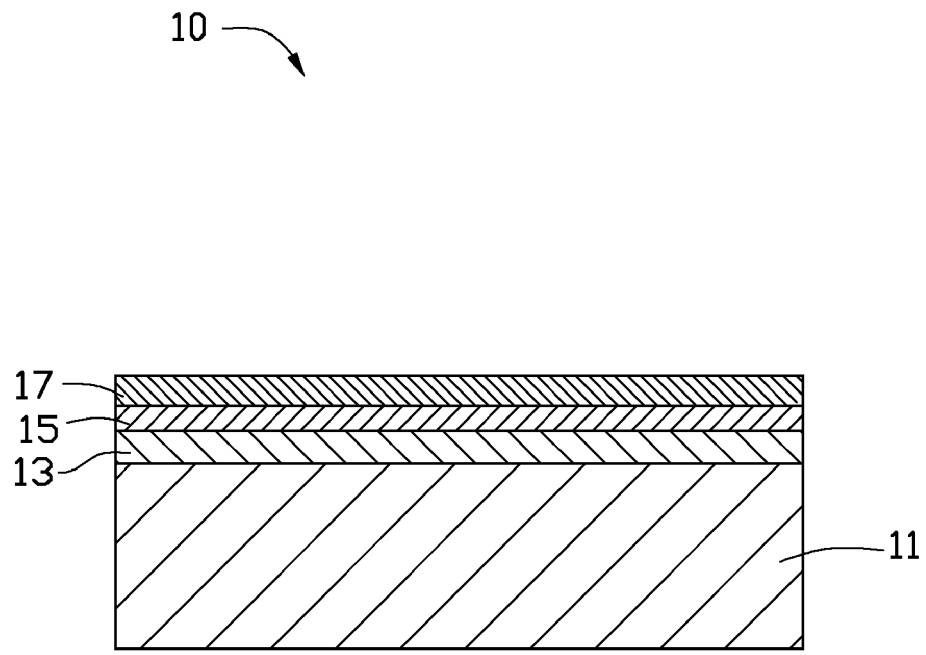
FIG. 1 illustrates a cross-sectional view of an exemplary embodiment of a coated glass.

FIG. 1 shows a coated glass 10 according to an exemplary embodiment. The coated glass 10 includes a substrate 11, a first conductive layer 13, a metallic layer 15 and a second conductive layer 17. The substrate 11 is made of glass. The first conductive layer 13 is coated on the substrate 11. The metallic layer 15 is coated on the first conductive layer 13. The second conductive layer 17 is coated on the metal layer 15. In this embodiment, the first conductive layer 13, the metallic layer 15 and the second conductive layer 17 can be provided by deposition techniques, such as sputtering deposition. The first conductive layer 13 and the second conductive layer 17 are transparent, and each has a thickness of about 200 nm to about 400 nm. The first conductive layer 13 may consist essentially of tin oxide, antimony oxide and zinc oxide. In the exemplary embodiments, the first conductive layer 13 is consisted of tin oxide, antimony oxide and zinc oxide. Zinc oxide of the first conductive layer 13 has a mole percentage in a range from about 30% to about 50%. The antimony oxide of the first conductive layer 13 has a mole percentage in a range from about 1% to about 5%. The remaining is tin oxide. The composition and proportion of the second conductive layer 17 is the same as the first conductive layer 13.

The metallic layer 15 is sandwiched between the first conductive layer 13 and the second conductive layer 17. The metal layer 15 has a thickness of about 10 nm to about 25 nm. The metal layer 15 is made of high conductivity and high reflectivity material. In this exemplary embodiment, the metal layer 15 is made of silver (Ag) or alloy (Al).

In the coated glass, since some of ions of $Sn^{4-}$ and $Zn^{2+}$ are replaced with the ions of $Sb^{+3}$ and $Sb^{+5}$ to produce a plurality of free electrons, this greatly increases the conductivity of the coated glass. The coated glass 10 has a resistivity of about $2 \times 10^{-3}$ ohm-metres ($\Omega$-m) to $5 \times 10^{-3}$ $\Omega$-m. In addition, the thickness of the first conductive layer 13 and the second conductive layer 17 may effectively secure a high light transmission rate. The coated glass 10 has a light transmission rate of about 85% to about 87.5%.

A method for making the coated glass 10 may include the following steps:

The substrate 11 is pretreated. The pre-treating process may include the following steps:

The substrate 11 is cleaned in an ultrasonic cleaning device (not shown), which is filled with ethanol or acetone. The cleaning time is about 5 min to about 10 min.

Figure 2:
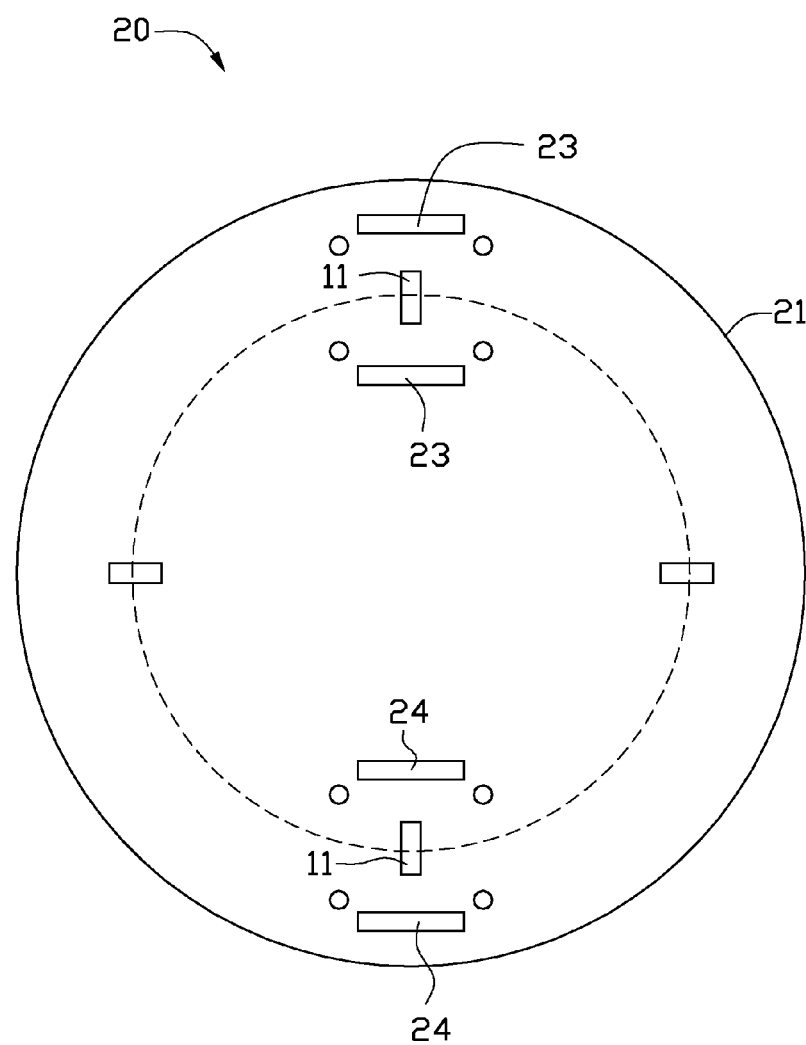
FIG. 2 is a schematic view of a magnetron sputtering coating machine for manufacturing the glass in FIG. 1.

The substrate 11 is plasma cleaned. Referring to FIG. 2, the substrate 11 is positioned in a plating chamber 21 of a vacuum sputtering machine 20. The plating chamber is then evacuated to about $3.0 \times 10^{-3}$ Pa to about $5.0 \times 10^{-3}$ Pa. Argon (Ar) may be used as a working gas and be fed into the chamber 21 at a flow rate from about 200 to about 400 standard cubic centimeter per minute (sccm). The substrate 11 may be biased with negative bias voltage at a range of −200 V to about −300 V, then high-frequency voltage is produced in the plating chamber 21 and the Ar is ionized to plasma. The plasma then strikes the surface of the substrate 11 to clean the surface of the substrate 11. Plasma cleaning the substrate 11 may take about 10 to about 20 minutes. The plasma cleaning process makes the substrate 11 form a coarse or rugged surface for enhance the bond between the substrate 11 and the layer on the substrate 11.

At least one target 23 is fixed in the plating chamber 21. In this exemplary embodiment, the target 23 is made of Sn powder, Sb powder, and Zn powder. The metal powers are mixed and are sintered to form the target 23.

The first conductive layer 13 is vacuum sputtered on the substrate 11. During the process, the inside of the plating chamber 21 is heated from about 120° C. to about 200° C. Argon (Ar) as a working gas is fed into the chamber 21 at a flow rate of about 300 sccm. Oxygen ($O_2$) is used as reaction gas and is fed into the chamber at a flow rate of about 50 sccm to about 88 sccm. Power of about 5 kw to about 7 kw is now applied to the target 23, and the substrate 11 may be biased with negative bias voltage of about −100 V to about −150 V to deposit the first conductive layer 12 on the substrate 11. Depositing of the first conductive layer 13 may take from about 30 to about 50 minutes.

In this exemplary embodiment, the process of manufacturing the target 23 may include at least the following steps: mixing Sn, Sb, Zn powder to form a mixture. The Sn metal has an atomic percentage in a range from about 45% to about 65%. The Zn metal has an atomic percentage in a range from about 30% to about 45%. The Sb metal has an atomic percentage in a range from about 1% to about 5%. The mixture is pressed into a blank at a press force in a range from about $1.0 \times 10^5$ N to about $20 \times 10^5$ N. The blank is sintered at a temperature in the furnace from about 550° C. to about 650° C. from about 1.5 hours to about 3 hours.

After the first conductive layer 13 is formed on the substrate 11, the metallic layer 15 is formed on the first conductive layer 13 by vacuum sputter deposition. First, at least one target 24 is provided. The target 24 is made of Ag or Al. During the process, the inside of the plating chamber 21 is heated from about 100° C. to about 120° C. Argon (Ar) as a working gas is fed into the chamber 21 at a flow rate of about 300 sccm. Power of about 2 kw to about 3 kw is now applied to the target 24, and the substrate 11 may be biased with negative bias voltage to deposit the metallic layer 15 on the first conductive layer 12. The negative bias voltage may be about −100 V to about −150 V. Depositing of the metal layer 15 may take about 30 to about 60 minutes. The metal layer 15 has a thickness of about 10 nm to about 25 nm.

After the metal layer 15 is formed on the first conductive layer 13, the second conductive layer 17 is formed on the metal layer 15 by vacuum sputter deposition. The target 23 is reopened. During the process, the inside of the plating chamber 21 is heated from about 120° C. to about 200° C. Argon (Ar) as a working gas is fed into the chamber 21 at a flow rate of about 300 sccm. Oxygen ($O_2$) is used as reaction gas, and is fed into the chamber, at a flow rate of about 50 sccm to about 88 sccm. Power of about 5 kw to about 7 kw is now applied to the target 23, and the substrate 11 may be biased with negative bias voltage to deposit the second conductive layer 17 on the metallic layer 15. The negative bias voltage may be about −100 V to about −150 V. Depositing of the second conductive layer 17 may take from about 30 to about 50 minutes.

The above coated glass 10 may have a low resistivity since the metallic layer 15 is disposed between the first conductive layer 13 and the second conductive layer 17. Since a plurality of free electrons is produced on the first conductive layer 13 and the second conductive layer 17, this greatly increases the conductivity of the coated glass.

The present disclosure is described further in detail using examples as follows, but is not limited by the following examples.

All of the embodiments are finished by a vacuum sputtering machine 20, and is plasma cleaned at the same parameter. The vacuum sputtering machine 20 is a medium frequency magnetron sputtering device (model No. SM-1100H) manufactured by South Innovative Vacuum Technology Co., Ltd. located in Shenzhen, China. The substrate 11 is made of glass. Plasma cleaning the substrate 11 is with Ar at a flow rate of about 400 sccm. The substrate 11 is biased with −300V negative bias voltage. Plasma cleaning the substrate 11 may take about 10 minutes.

EXAMPLE I

The first conductive layer 13, the metallic layer 15 and the second conductive layer 17 are vacuum sputtered on the substrate 11 according to the parameters shown in TABLE 1. The coated glass 10 achieved from the first exemplary embodiment has a first conductive layer 13 and a second conductive layer 17. Zinc oxide of the first, second conductive layer 13, 17 has a mole percentage in a range from about 43% to about 44%. Antimony oxide of the first, second conductive layer 13, 17 has a mole percentage in a range from about 4% to about 4.5%. The remaining is tin oxide.

TABLE 1

| Example I | Target (atomic percentage) | Power (kw) | bias voltage (V) | Ar (sccm) | $O_2$ (sccm) | T (° C.) | Time (minutes) | Thickness (nm) |
|---|---|---|---|---|---|---|---|---|
| First layer 13 | 50% Sn, 5% Sb, 45% Zn | 5 | −150 | 300 | 60 | 150 | 35 | 328 |
| metallic layer 15 | Ag | 2.5 | −100 | 300 | — | 100 | 30 | 15 |
| second layer 17 | 50% Sn, 5% Sb, 45% Zn | 5 | −150 | 300 | 60 | 150 | 35 | 330 |

The coated glass 10 achieved from the first embodiment has a resistivity of about $3.78 \times 10^{-3}$ Ω-m to $4 \times 10^{-3}$ Ω-m. The coated glass 10 has a light transmission rate of about 85% to about 86%.

EXAMPLE II

The first conductive layer 13, the metallic layer 15 and the second conductive layer 17 are vacuum sputtered on the substrate 11 according to the parameters shown in TABLE 2. Zinc oxide of the first, second conductive layer 13, 17 has a mole percentage in a range from about 27% to about 28.5%. Antimony oxide of the first, second conductive layer 13, 17 has a mole percentage in a range from about 4% to about 4.2%. The remaining is tin oxide.

TABLE 2

| Example 2 | Target (atomic percentage) | Power (kw) | bias voltage (V) | Ar (sccm) | $O_2$ (sccm) | T (° C.) | Time (minutes) | Thickness (nm) |
|---|---|---|---|---|---|---|---|---|
| First layer 13 | 65% Sn, 5% Sb, 30% Zn | 5 | −150 | 300 | 75 | 150 | 40 | 363 |
| metallic layer 15 | Ag | 2.5 | −100 | 300 | — | 100 | 30 | 16 |

TABLE 2-continued

| Example 2 | Target (atomic percentage) | Power (kw) | bias voltage (V) | Ar (sccm) | $O_2$ (sccm) | T (° C.) | Time (minutes) | Thickness (nm) |
|---|---|---|---|---|---|---|---|---|
| second layer 17 | 65% Sn, 5% Sb, 30% Zn | 5 | −150 | 300 | 75 | 150 | 40 | 363 |

The coated glass 10 achieved from the first embodiment has a resistivity of about $1.98 \times 10^{-3}$ Ω-m to $2.2 \times 10^{-3}$ Ω-m. The coated glass 10 has a light transmission rate of about 86% to about 86.7%.

EXAMPLE III

The first conductive layer 13, the metallic layer 15 and the second conductive layer 17 are vacuum sputtered on the substrate 11 according to the parameters shown in TABLE 3. Zinc oxide of the first, second conductive layer 13, 17 has a mole percentage in a range from about 38% to about 39.3%. Antimony oxide of the first, second conductive layer 13, 17 has a mole percentage in a range from about 4% to about 4.3%. The remaining is tin oxide.

TABLE 3

| Example 3 | Target (atomic percentage) | Power (kw) | bias voltage (V) | Ar (sccm) | $O_2$ (sccm) | T (° C.) | Time (minutes) | Thickness (nm) |
|---|---|---|---|---|---|---|---|---|
| First layer 13 | 55% Sn, 5% Sb, 40% Zn | 6 | −150 | 300 | 65 | 200 | 35 | 300 |
| metallic layer 15 | Al | 3 | −100 | 300 | — | 100 | 30 | 17.5 |
| second layer 17 | 55% Sn, 5% Sb, 40% Zn | 6 | −150 | 300 | 65 | 200 | 35 | 305 |

The coated glass 10 achieved from the first embodiment has a resistivity of about $2.3 \times 10^{-3}$ Ω-m to $2.6 \times 10^{-3}$ Ω-m. The coated glass 10 has a light transmission rate of about 86% to about 87%.

EXAMPLE IV

The first conductive layer 13, the metallic layer 15 and the second conductive layer 17 are vacuum sputtered on the substrate 11 according to the parameters shown in TABLE 4. Zinc oxide of the first, second conductive layer 13, 17 has a mole percentage in a range from about 30% to about 32.8%. Antimony oxide of the first, second conductive layer 13, 17 has a mole percentage in a range from about 1.5% to about 1.8%. The remaining is tin oxide.

TABLE 4

| Example 4 | Target (atomic percentage) | Power (kw) | bias voltage (V) | Ar (sccm) | $O_2$ (sccm) | T (° C.) | Time (minutes) | Thickness (nm) |
|---|---|---|---|---|---|---|---|---|
| First layer 13 | 64% Sn, 2% Sb, 34% Zn | 5 | −150 | 300 | 55 | 180 60 | 30 | 328 |
| metallic layer 15 | Al | 2.6 | −100 | 300 | — | 100 | 30 | 16 |
| second layer 17 | 64% Sn, 2% Sb, 34% Zn | 6 | −150 | 300 | 55 | 150 65 | 30 | 326 |

The coated glass 10 achieved from the first embodiment has a resistivity of about $2.87\times10^{-3}$ Ω-m to $3.12\times10^{-3}$ Ω-m. The coated glass 10 has a light transmission rate of about 85% to about 86%.

EXAMPLE V

The first conductive layer 13, the metallic layer 15 and the second conductive layer 17 are vacuum sputtered on the substrate 11 according to the parameters shown in TABLE 5. Zinc oxide of the conductive layer 13, 17 has a mole percentage in a range from about 37.5% to about 39%. Antimony oxide of the conductive layer 13, 17 has a mole percentage in a range from about 2.5% to about 2.8%. The remaining is tin oxide.

TABLE 5

| Example 5 | Target (atomic percentage) | Power (kw) | bias voltage (V) | Ar (sccm) | $O_2$ (sccm) | T (° C.) | Time (minutes) | Thickness (nm) |
|---|---|---|---|---|---|---|---|---|
| First layer 13 | 57% Sn, 3% Sb, 40% Zn | 5 | −150 | 300 | 68 | 120 | 35 | 313 |
| metallic layer 15 | Ag | 2.8 | −100 | 300 | — | 100 | 30 | 18.5 |
| second layer 17 | 57% Sn, 3% Sb, 40% Zn | 5 | −150 | 300 | 55 | 120 | 35 | 311 |

The coated glass 10 achieved from the first embodiment has a resistivity of about $4.4\times10^{-3}$ Ω-m to $4.72\times10^{-3}$ Ω-m. The coated glass 10 has a light transmission rate of about 87% to about 87.5%.

EXAMPLE VI

The first conductive layer 13, the metallic layer 15 and the second conductive layer 17 are vacuum sputtered on the substrate 11 according to the parameters shown in TABLE 6. Zinc oxide of the first, second conductive layer 13, 17 has a mole percentage in a range from about 32% to about 33.1%. Antimony oxide of the first, second conductive layer 13, 17 has a mole percentage in a range from about 0.7% to about 0.85%. The remaining is tin oxide.

TABLE 6

| Example 6 | Target (atomic percentage) | Power (kw) | bias voltage (V) | Ar (sccm) | $O_2$ (sccm) | T (° C.) | Time (minutes) | Thickness (nm) |
|---|---|---|---|---|---|---|---|---|
| First layer 13 | 65% Sn, 1% Sb, 34% Zn | 5 | −150 | 300 | 80 | 150 | 40 | 328 |
| metallic layer 15 | Al | 2.5 | −100 | 300 | — | 100 | 30 | 15.6 |
| second layer 17 | 65% Sn, 1% Sb, 34% Zn | 5 | −150 | 300 | 80 | 150 | 40 | 327 |

The coated glass 10 achieved from the first embodiment has a resistivity of about $4.8\times10^{-3}$ Ω-m to $5.1\times10^{-3}$ Ω-m. The coated glass 10 has a light transmission rate of about 86% to about 86.8%.

EXAMPLE VII

The first conductive layer 13, the metallic layer 15 and the second conductive layer 17 are vacuum sputtered on the substrate 11 according to the parameters shown in TABLE 7. Zinc oxide of the first, second conductive layer 13, 17 has a mole percentage in a range from about 27.5% to about 29.3%. Antimony oxide of the first, second conductive layer 13, 17 has a mole percentage in a range from about 4% to about 4.5%. The remaining is tin oxide.

TABLE 7

| Example 7 | Target (atomic percentage) | Power (kw) | bias voltage (V) | Ar (sccm) | $O_2$ (sccm) | T (° C.) | Time (minutes) | Thickness (nm) |
|---|---|---|---|---|---|---|---|---|
| First layer 13 | 65% Sn, 5% Sb, 30% Zn | 6 | −150 | 300 | 85 | 180 | 40 | 361 |
| metallic layer 15 | Ag | 3 | −100 | 300 | — | 100 | 30 | 16.7 |
| second layer 17 | 65% Sn, 5% Sb, 30% Zn | 5 | −150 | 300 | 85 | 180 | 40 | 363 |

The coated glass 10 achieved from the first embodiment has a resistivity of about $4\times10^{-3}$ Ω-m to $4.25\times10^{-3}$ Ω-m. The coated glass 10 has a light transmission rate of about 86% to about 86.5%.

In the coated glass, since some of ions of $Sn^{4-}$ and $Zn^{2+}$ are replaced with the ions of $Sb^{+3}$ and $Sb^{+5}$ to produce a plurality of free electrons, this greatly increases the conductivity of the coated glass. In addition, the thickness of the first conductive layer 13 and the second conductive layer 17 may effectively secure a high light transmission rate.

It is believed that the exemplary embodiment and its advantages will be understood from the foregoing description, and it will be apparent that various changes may be made thereto without departing from the spirit and scope of the disclosure or sacrificing all of its advantages, the examples hereinbefore described merely being preferred or exemplary embodiment of the disclosure.

What is claimed is:

1. A coated glass, comprising:
a substrate;
a first conductive layer deposited on the substrate;
a metallic layer deposited on the first conductive layer; and
a second conductive layer deposited on the metallic layer;
wherein the first conductive layer and the second conductive layer consist essentially of tin oxide, antimony oxide and zinc oxide.

2. The coated glass as claimed in claim 1, wherein the first conductive layer and the second conductive layer is consisted of tin oxide, antimony oxide and zinc oxide, zinc oxide has a mole percentage in a range from about 30% to about 50%, antimony oxide has a mole percentage in a range from about 1% to about 5%, and the remaining is tin oxide.

3. The coated glass as claimed in claim 1, wherein the coated glass has a resistivity of about $2\times10^{-3}$ Ω-m to $5\times10^{-3}$ Ω-m, the light transmission rate is about 85% to about 87.5%.

4. The coated glass as claimed in claim 1, wherein the first conductive layer has a thickness of about 270 nm to about 400 nm, the metallic layer has a thickness of about 10 nm to about 25 nm, and the second conductive layer has a thickness of about 270 nm to about 400 nm.

5. The coated glass as claimed in claim 1, wherein the metallic layer is made of silver or alloy.

6. A coated glass, comprising:
a first conductive layer and a second conductive layer;
a metallic layer sandwiched between the first conductive layer and the second conductive layer; and
wherein the first conductive layer and the second conductive layer consist essentially of tin oxide, antimony oxide and zinc oxide.

7. The coated glass as claimed in claim 6, wherein the first conductive layer and the second conductive layer is consisted of tin oxide, antimony oxide and zinc oxide, zinc oxide has a mole percentage in a range from about 30% to about 50%, antimony oxide has a mole percentage in a range from about 1% to about 5%, and the remaining is tin oxide.

8. The coated glass as claimed in claim 6, wherein the first conductive layer has a thickness of about 270 nm to about 400 nm, the metallic layer has a thickness of about 10 nm to about 25 nm, and the second conductive layer has a thickness of about 270 nm to about 400 nm.

9. The coated glass as claimed in claim 6, wherein the metallic layer is made of silver or alloy.

* * * * *